(12) United States Patent
Shao et al.

(10) Patent No.: US 12,185,460 B2
(45) Date of Patent: Dec. 31, 2024

(54) ULTRA-THIN LAMINATED GLASS ASSEMBLY WITH ELECTRIC CIRCUITRY

(71) Applicant: Fuyao Glass America Inc., Moraine, OH (US)

(72) Inventors: Yue Shao, Moraine, OH (US); Mouzhi Zhang, Detroit, MI (US)

(73) Assignee: Fuyao Glass America Inc., Moraine, OH (US)

( * ) Notice: Subject to any disclaimer, the term of this patent is extended or adjusted under 35 U.S.C. 154(b) by 249 days.

(21) Appl. No.: 17/698,027

(22) Filed: Mar. 18, 2022

(65) Prior Publication Data

US 2023/0009931 A1    Jan. 12, 2023

Related U.S. Application Data

(60) Provisional application No. 63/219,778, filed on Jul. 8, 2021, provisional application No. 63/312,185, filed on Feb. 21, 2022.

(51) Int. Cl.
| | | |
|---|---|---|
| *H05K 1/03* | (2006.01) | |
| *H05K 1/02* | (2006.01) | |
| *H05K 1/09* | (2006.01) | |

(52) U.S. Cl.
CPC ......... *H05K 1/0306* (2013.01); *H05K 1/0274* (2013.01); *H05K 1/09* (2013.01); *H05K 2201/1028* (2013.01)

(58) Field of Classification Search
CPC .. H05K 1/02; H05K 1/03; H05K 1/09; H05K 1/0274; H05K 1/0306

USPC .......................................................... 174/255
See application file for complete search history.

(56) References Cited

U.S. PATENT DOCUMENTS

| | | |
|---|---|---|
| 5,099,104 A | 3/1992 | Holzer et al. |
| 2013/0062119 A1 | 3/2013 | Schlarb et al. |

FOREIGN PATENT DOCUMENTS

| | | |
|---|---|---|
| DE | 202004019286 U1 | 4/2006 |
| EP | 0593940 A1 | 4/1994 |
| JP | 2019084953 A | 6/2019 |

OTHER PUBLICATIONS

Extended European Search Report for European Patent Application No. 22183966.5; European Patent Office, 80298 Munich, Germany; dated Nov. 11, 2022.

*Primary Examiner* — Tremesha W Burns
(74) *Attorney, Agent, or Firm* — Thomas E. Lees, LLC

(57) ABSTRACT

A laminated glass assembly, an electrical assembly for a laminated glass assembly and a method of forming a laminated glass assembly. The laminated glass assembly includes at least an outer glass plate having a first major surface and a second major surface, an inner ultra-thin glass plate having a first major surface and a second major surface and an intermediate film layer situated between the outer glass plate and the inner ultra-thin glass plate. The electrical assembly is positioned between the outer glass plate and the inner ultra-thin glass plate along with a conductive medium to provide a signal path between the laminated glass assembly and vehicular electrical circuitry.

18 Claims, 8 Drawing Sheets

ULTRA-THIN LAMINATED GLASS ASSEMBLY WITH ELECTRIC CIRCUITRY

This application claims the benefit of U.S. Provisional Patent Application Ser. No. 63/219,778 that was filed on Jul. 8, 2021 and U.S. Provisional Patent Application Ser. No. 63/312,185 that was filed on Feb. 21, 2022.

The present specification relates generally to a laminated glass assembly and more specifically to a laminated glass assembly having an ultra-thin glass layer and electrically-conductive circuitry, both to enhance the functionality of the laminated glass assembly.

BACKGROUND

There are numerous applications that utilize a glass window. One notable example is that of a vehicle windshield. A typical modern windshield is a layered assembly that includes optically transparent layers of an outer glass, an inner glass and an intermediate polymeric-based material. Conventional windshield assemblies often include electrically conductive traces that are connected to the glass through soldering, printing or the like, where the thickness of the glass is typically between about 4 and 6 millimeters (mm). Unfortunately, any attempt to reduce the thickness of conventional windshield assemblies causes incompatibilities between the glass and the electrically conductive traces, particularly when using a method of manufacture that involves exposing the layered assembly to one or more of differential pressures and elevated temperature.

SUMMARY

The various aspects disclosed herein provide ways to utilize ultra-thin glass in a laminated glass assembly that also includes electrically conductive features the latter of which provides circuitry for uses such as a communications antenna, a window defroster, a heads-up display (HUD), to impart electrochromic properties to the glass (such as to produce changes in color or opacity), as well as others including to form interface circuitry to integrate with a camera, sensor or other electrical device. Nevertheless, because the use of an ultra-thin layer of glass is very smooth, the authors of the present disclosure discovered that it does not readily lend itself to conventional printing or related deposition approaches that hitherto were used to arrange traditional forms of electrically conductive circuits, traces or patterns. They further discovered that even if a deposited electrical circuit were to be placed on the ultra-thin glass, a subsequent autoclaving or related vacuum-and-temperature environment that is used to fabricate the laminated glass assembly would adversely impact the quality of the finished product. The authors of the present disclosure have further discovered that because improvements in weight, operational efficiency, strength, better environmental protection and other factors are important design considerations for the next generation of automobiles and related vehicles, using a laminated glass assembly with at least one ultra-thin layer along with electrical circuitry that are compatible with conventional autoclaving operations is a key enabler of these vehicles of the future.

As such, and according to an aspect of the present disclosure, a laminated glass assembly includes at least an outer glass plate layer or sheet, an inner ultra-thin glass plate layer or sheet and an intermediate film layer or sheet situated between the outer glass plate and the inner ultra-thin glass plate layers. Further, an electrical assembly is also placed adjacent the inner and outer glass plate layers to form a connector that allows the conveyance of signals between the laminated glass assembly and a vehicular source of electric current. The electrical assembly is configured with flexible, electrically conductive ribbon-based construction for placement relative to the laminated glass assembly in a manner sufficient to replace the previously discussed deposited traces.

Furthermore, according to another aspect of the present disclosure, a method of making a laminated glass assembly includes placing a pair of glass sheets in a mold, the glass sheets comprising an outer layer and an ultra-thin inner layer each of which defines a first major surface and a second major surface. After that, the pair of glass sheets are heated and shaped, as well as placing at least one polymeric intermediate layer between them. In addition, an electrical assembly is placed relative to the shaped pair of glass sheets such that a first portion of the electrical assembly is disposed between the outer layer and the ultra-thin inner layer while a second portion of the electrical assembly is disposed on the second major surface of the ultra-thin inner layer. Furthermore, compression bonding is used on the shaped pair of glass sheets, polymeric intermediate layer and electrical assembly together such that air is substantially removed.

BRIEF DESCRIPTION OF THE SEVERAL VIEWS OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

According to various aspects of the present disclosure, the combination of ultra-thin glass and novel electrical conductivity improves the technologies of a laminated glass assembly. In particular, various aspects of the present disclosure address the technical problem of achieving lighter-weight glass assemblies with improved electrical connectivity properties while being compatible with best-practice glass assembly techniques. The technical solutions herein bring about several technical effects, including the formation of reduced weight assemblies that exhibit greater resistance to defective attachment between the laminated glass and the electric circuitry.

Within the present disclosure, the term "windshield" and its variants generally refer to an optically transparent glass assembly that is configured for placement within the forward-looking portion of a vehicle such that an operator or passenger is able to see through the windshield along the forward travel path of the vehicle, but also can refer to other vehicular glass assemblies such as rear windows, side windows, roof panels or the like. Whether the term is to be construed as covering merely the forward-looking embodiment in particular or one or more of the other embodiments will be apparent from the context, noting that all such assemblies are deemed to be within the scope of the present disclosure. Also within the present disclosure, the ultra-thin layer of glass being used in a windshield—as well as other glass assemblies such as those in construction or other transportation-related applications—is defined generally as having a thickness of less than about 1.5 mm, and includes specific variants with thickness ranging from between 0.4 and 1.2 mm. In many embodiments, the inner ultra-thin glass plate has a thickness between about 0.4 mm and 1.2 mm, e.g. 0.55 mm, 0.7 mm, 0.8 mm, 0.9 mm, or 1.0 mm, 1.1 mm. In many embodiments, the outer glass plate has a thickness between about 1.5 mm and 6 mm, e.g., 1.8 mm, 2.1 mm, 2.5 mm, 2.8 mm, 3.0 mm, 3.2 mm, 3.5 mm, 3.8 mm, 4.0 mm, 4.5 mm, 4.8 mm, 5.0 mm, 5.5 mm, or 6.0 mm. Despite being thinner than conventional laminated glass (each layer of the conventional laminated glass having a thickness between 2 mm and 6 mm), a windshield or other laminated glass assembly with an ultra-thin layer as disclosed herein possesses desirable mechanical and optical properties, including high strength, low fragility, scratch and break resistance and a high degree of smoothness while maintaining a resistance to heat or pressure-related damage associated with autoclaving and related laminated glass fabrication techniques.

Figure 1:
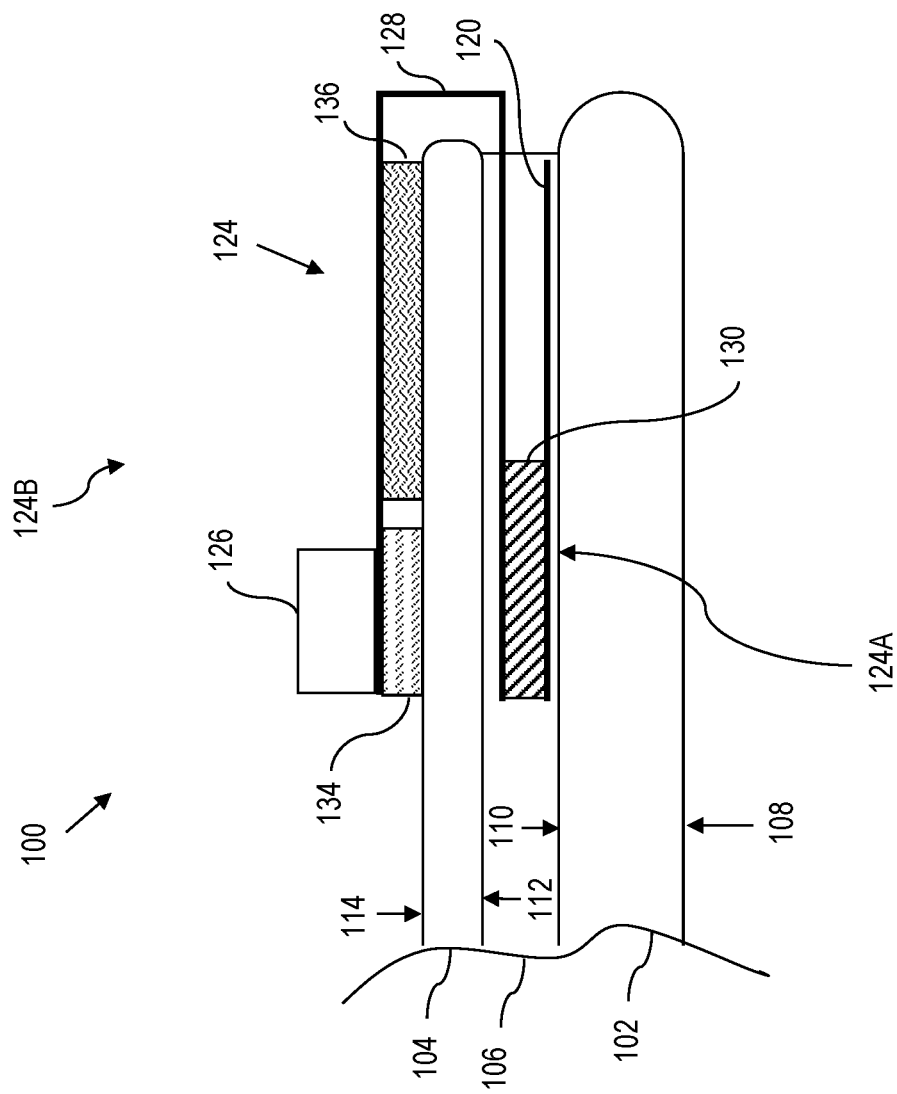
FIG. 1 is a partial edge view of a first embodiment of a laminated glass assembly according the present disclosure.
Figure 2A:
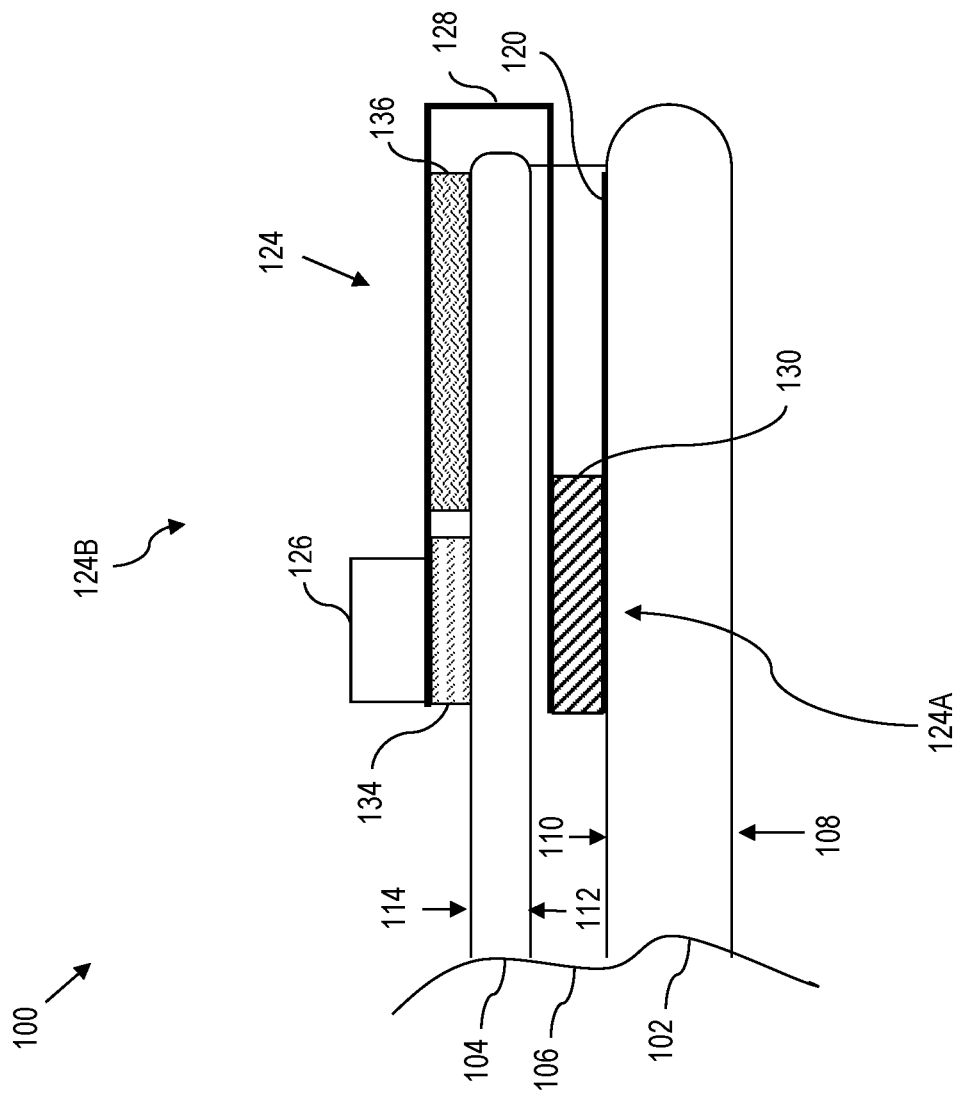
FIGS. 2A and 2B are partial edge views of connectivity options for the laminated glass assembly of FIG. 1.
Figure 2B:
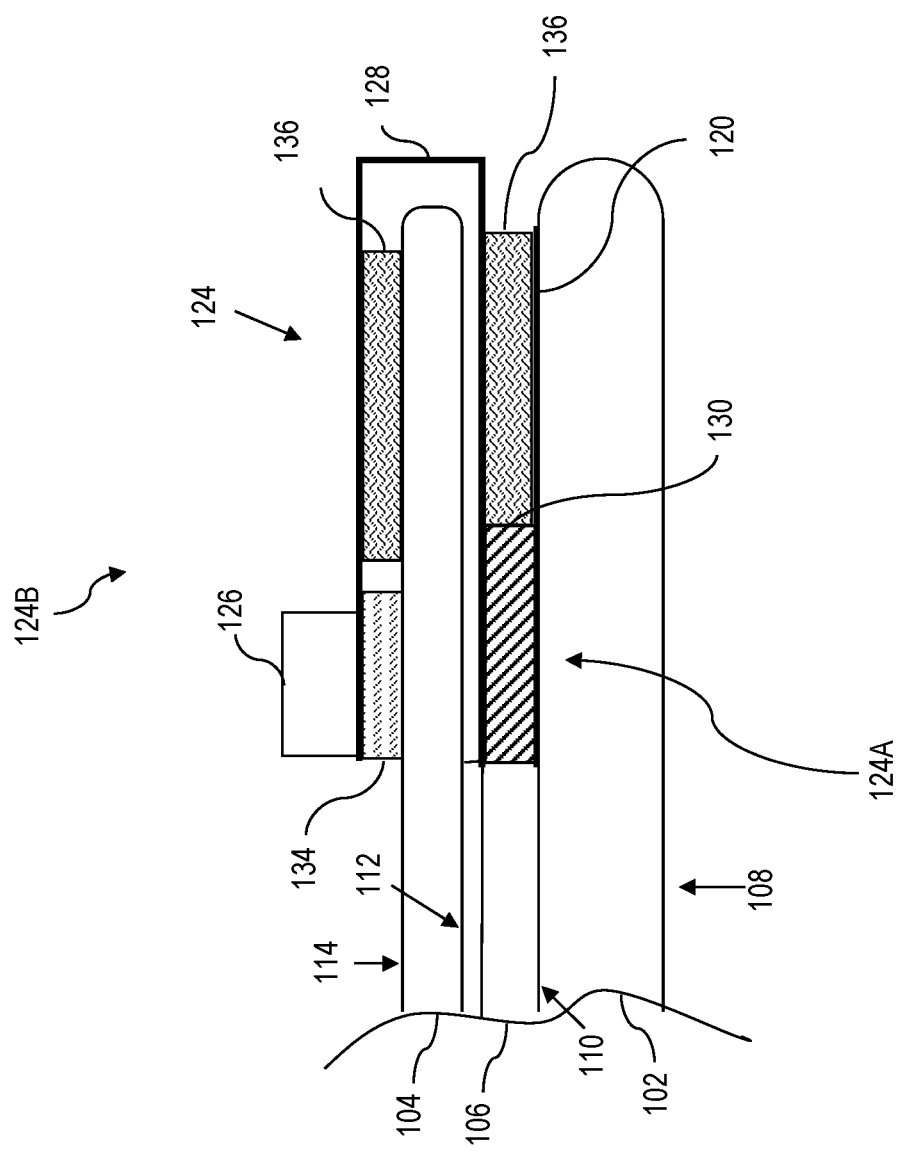

Referring first to FIGS. 1, 2A and 2B, a partial side (that is to say, edge) view illustrates aspects of an ultra-thin laminated glass assembly (also referred to more succinctly as a laminated glass assembly) 100 according to the present disclosure. As can be seen, the laminated glass assembly 100 forms a multilayer optically-transparent structure that includes an outer glass plate (or layer) 102, an inner ultra-thin glass plate (or layer) 104 and an intermediate layer 106. In the context of a windshield, the outer glass plate 102 is that which is oriented or exposed to the outside of a corresponding vehicle (not shown). Likewise, the inner ultra-thin glass plate 104 is that which is oriented or exposed to the interior cabin of the corresponding vehicle. It will be appreciated that these are terms of referential convenience such that the laminated glass assembly 100 as disclosed herein should not be construed as limited to orienting these plates as "outer" and "inner" unless contextual clarity dictates otherwise. Moreover, the term "plate" when used in conjunction with the outer glass plate 102 and inner ultra-thin glass plate 104 is for convenience of discussion; it will be understood that the surface of such "plate" is not required to be planar and may have some curve associated therewith (such as when used as a windshield, back window, side window, roof panel or the like for vehicles, such as for automobiles, industrial vehicles, work vehicles, trains, aircraft or the like). In addition, any spaces depicted in the drawings between the various components are there just for ease of visualization and may or may not be indicative of the actual nature of connection between such components, particularly in an as-fabricated state of the laminated glass assembly 100. Furthermore, it will be appreciated that the thicknesses depicted of the various components may be exaggerated for clarity of visualization. In this regard, the various elements and components are not necessarily drawn to scale.

The outer glass plate 102 includes a first major surface 108 and a second major surface 110. For spatial orientation purposes within the context of an automotive windshield, the first major surface 108 functions as an outward-looking surface on the outside of the vehicle (not shown) such that it faces—and is be exposed—to the ambient (outside) environment, whereas the second major surface 110 functions as an inward-looking surface that is not exposed to the ambient environment. By way of example, the outer glass plate 102 may be made from soda lime glass, aluminosilicate glass, borosilicate glass, polymethyl methacrylate (PMMA), polycarbonate (PC) or the like, and in one embodiment has a thickness between about 1.5 and 6 mm. In a similar way, the inner ultra-thin glass plate 104 includes a first major surface 112 and a second major surface 114 where the former is outward-looking and the latter is inward-looking with the thickness as previously mentioned, although other (that is to say thinner) embodiments of the inner ultra-thin glass plate 104 are within the scope of the present disclosure. As can be seen, both the second major surface 110 of the outer glass plate 102 and the first major surface 112 of the inner ultra-thin glass plate 104 face the intermediate layer 106 that in one form may be an organic polymer film material such as polyvinyl butyral (PVB), a semi-crystalline ionomer-based material (such as SentryGlas® ionoplast or an equivalent), ethylene vinyl acetate (EVA), polyurethane film (PU) or the like. While the intermediate layer 106 provides some measure of structural integrity, its main purpose is to limit shattering of the laminated glass assembly 100 upon an impact.

In one form, the outer glass plate 102, intermediate layer 106 and inner ultra-thin glass 104 are permanently bonded together such that the laminated glass assembly 100 achieves at least one of sound insulation, heat insulation, infrared protection, or ultraviolet protection. In one form, a multi-step fabrication approach may be used to form the laminated glass assembly 100. Such process may include compression bonding that itself may be a multi-step process. For example, a first compression bonding step may include placing the shaped pair of glass sheets 102, 104, polymeric intermediate layer 106 and an electrical assembly 124 (which will be discussed in more detail as follows) together in a vacuum bag (not shown) and then subjecting them to a partially evacuated environment (for example, between about −10 psi and −15 psi) along with elevated temperature (for example, between about 160° F. and 230° F.). Likewise, a second compression bonding step may involve using elevated temperatures (for example, between about 250° F. and 300° F.) and pressures (for example, between about 140 psi and 210 psi). At least this second compression bonding step may be performed in an autoclave (not shown). Significantly, using the electrical assembly 124 in conjunction with the manufacturing steps as disclosed herein reduces the likelihood of air bubble formation in a region where the electrical assembly 124 is joined to the remainder of the laminated glass assembly 100. In this way, post-welding glass splits are avoided, while the absence of any residual air bubbles is a reliable indication of good adhesion performance of the electrical assembly 124 to the rest of the laminated glass assembly 100.

A conductive medium 120 resides within the laminated glass assembly 100. The conductive medium 120 may be any copper wire, tungsten wire, aluminum wire, silver wire, printed conductive ink or transparent conductive film made from various materials such as silver or silver alloy or a metal oxide such as indium tin oxide (ITO), fluorine-doped tin oxide (FTO), antimony-doped tin oxide (ATO), aluminum-doped zinc oxide (AZO) or the like. In one form, the conductive medium 120 may be used to convey electric signals through, along or across the laminated glass assembly 100 to facilitate certain vehicular-related functionality such as window heating, defrosting, anti-fogging, opacity or color changing, radio-frequency (RF) wireless communication (such as through an antenna), or connectivity to a HUD, camera, sensor or other vehicle electronics. That is, the conductive medium 120 may be used for any purpose that may require electric signals to operate in or around the laminated glass assembly 100, and that need to be conveyed between the laminated glass assembly 100 and other electronics systems within the vehicle. In the versions shown, the conductive medium 120 is disposed between a layer of solder 130 and the second major surface 110 of the outer glass plate 102. By avoiding direct contact between the solder 130 and the inner ultra-thin glass plate 104, the likelihood of cracking or other heat-related problems is reduced.

Various connectivity options and sequences are possible as a way to enable an electrically-conductive path from a terminal 126 to the conductive medium 120. As shown with particularity in FIG. 1, the solder 130, conductive medium 120 and a flexible metal ribbon (also called a metal foil, metal sheet or the like) 128 are secured to one another prior to their placement on the second major surface 110 of the outer glass plate 102. As shown with particularity in FIG. 2A, the conductive medium 120 is first pre-laid on, deposited on or otherwise secured to the outer glass plate 102 prior to joining to the metal ribbon 128 with the solder 130. As shown with particularity in FIG. 2B, the metal ribbon 128 is first coupled to the conductive medium 120 through solder 130 before (or concurrently with) attachment of the conductive medium 120 to the outer glass plate 102. It will be understood that the placement of the joined conductive medium 120 and metal ribbon 128 may be in or on the intermediate layer 106. Likewise, the order of joining options disclosed herein are merely exemplary, and that other orders or sequences may be used in order to promote ease of manufacture as well as overall structural integrity of the finished laminated glass assembly 100.

As can be seen in all of FIGS. 1, 2A and 2B, the various spaces that may or may not exist between the components are there just for ease of showing the components and how they may be coupled together. Moreover, thicknesses or lengths may be exaggerated or reduced for clarity of discussion. In this regard, elements are not necessarily drawn to scale. As such, the precise configuration of the electrical assembly 124 and conductive medium 120—as well as how the connect to other portions of the laminated glass assembly 100—may assume numerous optional forms. In a first optional form, the conductive medium 120 is formed as a silver pattern directly on the second major surface 110 of the outer plate 102. In a second optional form, the conductive medium 120 is formed as a conductive wire (using, for example, the aforementioned copper, tungsten, silver, aluminum or the like) that is placed on or otherwise engaged with the intermediate layer 106. In a third optional form, the conductive medium 120 is affixed to a portion of a metal ribbon 128 along with an insulating outer body 142 (both of which will be discussed in more detail as follows) in order to perform its electrical connectivity with traces or other vehicular electronic leads. Significantly, the overall thickness of the electrical assembly 124 is such that when folded over the edge of the laminated glass assembly 100, the ratio of such thickness to the radius of curvature of the ensuing fold is such that internal stresses and shear-related deformation are low enough to avoid cracking or related damage to the electrical assembly 124 as well as to promote a substantially flat fit with the surfaces of the laminated glass assembly 100; this last feature is particularly beneficial when subjecting the laminated glass assembly 100 to autoclaving and related laminated glass-forming operations. Within the present disclosure, the ability of the electrical assembly 124 to be bent, folded, wrapped or otherwise placed around the edge of the layers of the laminated glass assembly 100 while preserving its structural integrity (that is to say, substantially free of cracks or other indicia of compromised mechanical properties) along with a substantial degree of flatness (that is to say, without significant surface undulations that otherwise would lead to gaps and related manufacturing defects) means that the electrical assembly 124 is a flexible electrical assembly.

Referring next to FIGS. 3 through 10 in conjunction with FIG. 1, the electrical assembly 124 is used to convey electric current and related signals between vehicle electronics and the laminated glass assembly 100. It will be appreciated that although a single electrical assembly 124 is shown in the figures, multiple electrical assemblies 124 may be used at various places over the surface of the laminated glass assembly 100, depending on the need. It will likewise be appreciated that by configuring the electrical assembly 124 and laminated glass assembly 100 to cooperate with the conductive medium 120 in the manner disclosed herein, enhanced electrical functionality relative to conventional windshield or rear window assemblies is achieved, including the ability to provide a plurality of heating zones with differing power densities some of which may overlap one another. Relatedly, different antenna or related wireless communication circuits may be formed, also with frequency-specific structure formed throughout the windshield or rear window assembly.

Figure 5:
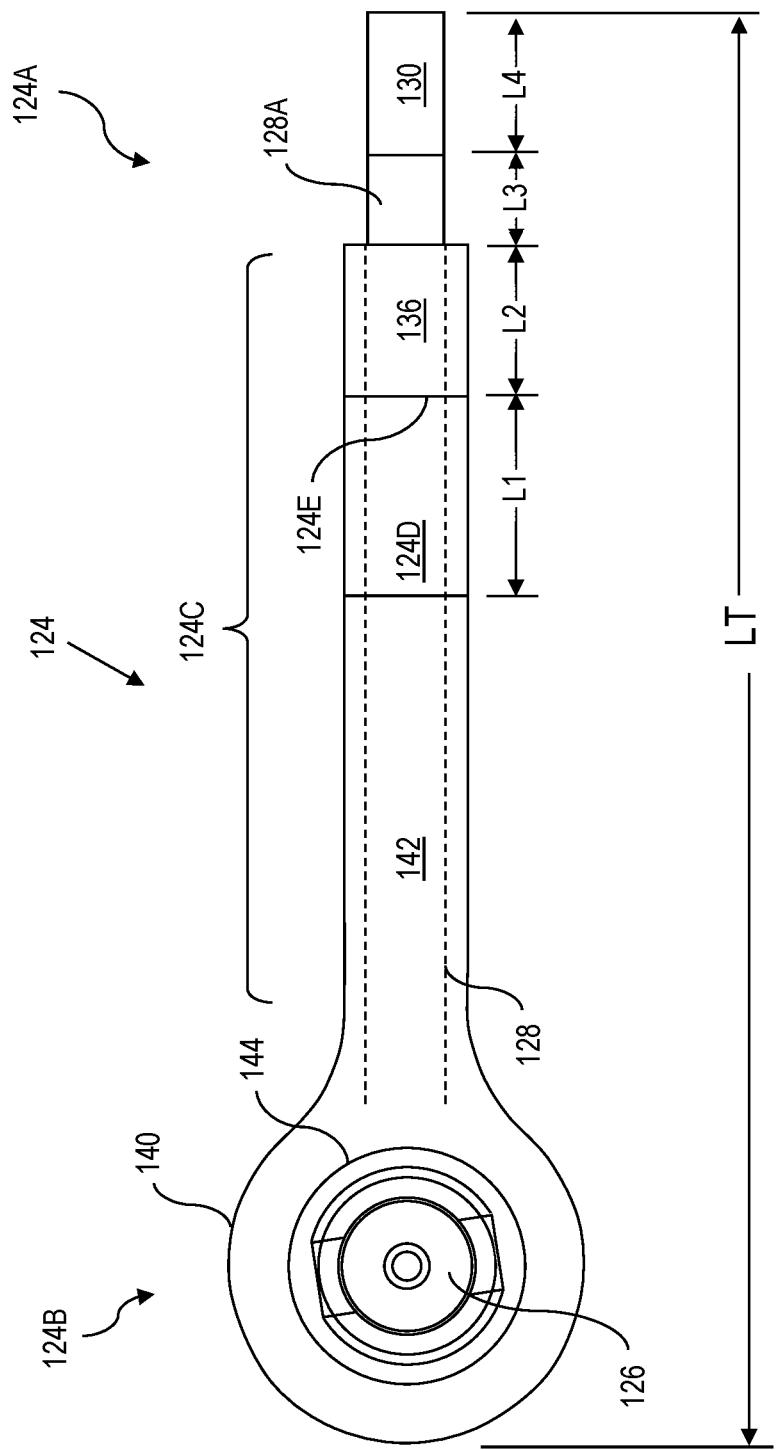
FIG. 5 is a top view of one embodiment of the tongue joint of FIG. 4.

As shown with particularity in FIG. 5, the electrical assembly 124 is depicted in isolation as an elongate structure configured as a tongue joint with a first portion 124A terminating in a tail at one end and a second portion 124B terminating as a head at the opposing end. In one embodiment, the length of the electrical assembly 124 is about 65 mm total. The electrical assembly 124 includes numerous components, including the terminal 126 that is electrically connected to the flexible metal ribbon 128. The terminal 126 is disposed at the head end of the second portion 124B. Although shown notionally as having a generally post-like cylindrical shape with a cupped upper portion and curvaceous sidewalls, it will be appreciated that the terminal 126 may assume any shape (including square or polygonal) to suitable for providing the necessary electrical connectivity with vehicular electronics, such as through a terminal connector and one or more wires, wire assemblies or related structure (none of which are shown). In addition, the terminal 126 may be configured as a dedicated electronic terminal, a general electronic terminal, a non-contact wireless conductive module or the like. The terminal 126 is coupled to an enlarged and circular-shaped terminal pad 140 that forms part of the metal ribbon 128, such as through welding or other affixing approaches. In one embodiment, the terminal pad 140 and significant portions of the length of the metal ribbon 128 may be encased in the insulating outer body 142 that may be made from a polymer tape or film such as DuPont™ Kapton® polyimide film. In one form, the insulating outer body 142 may be sized to define a close conformal fit with the encased metal ribbon 128 and terminal pad 140. At its widest, the insulating outer body 142 is approximately 16 mm in diameter and narrow down to a width of about 5.5 mm. In one form, the metal sheet 128 is between about 0.2 and 1 mm thick and has a width of about 1.0 to 5.0 mm, while in a more particular form is about 0.3 mm thick with a width of about 3.5 mm to promote ease of encasement within the insulating outer body 142. It will be understood that specific electrical requirements may dictate or enable other thicknesses or widths, and that all such dimensional variants are deemed to be within the scope of the present disclosure.

In one form, the metal ribbon 128 is made from a tin-plated copper. Further, the metal sheet 128 can be formed as a unitary piece of single foil, or from multiple pieces of metal strips that are welded (or otherwise coupled) together. As will be understood, by having a foil-based structure, the generally planar opposing first and second major surfaces of the metal ribbon 128 are of a significantly larger dimension than their respective edgewise minor surfaces, as is the case with the insulating outer body 142.

Significantly, the second portion 124B of electrical assembly 124 (which encompasses the head and adjacent region that includes the terminal pad 140) couples to the second major surface 114 of the inner ultra-thin glass plate 104 via structural bonding tape 134 (such as 3M™ SBT). In this way, the terminal 126 and portions of the metal ribbon 128 and insulating outer body 142 that are situated directly above (as viewed in FIGS. 1, 2A and 2B) the structural bonding tape 134 form a secure adhesive connection with the generally planar and underlying second major surface 114 of the inner ultra-thin glass plate 104 without having to expose that side of the inner ultra-thin glass plate 104 to any soldering, welding or related attachment approaches that require the use of significant amounts of heat that could otherwise be damaging to the inner ultra-thin glass plate 104. In one form, the adhesive force of the structural bonding tape 134 may be greater than 80 Newtons (18 pounds). Likewise, the structural bonding tape 134 may have double-sided adhesive properties.

As shown with particularity in FIGS. 1, 2A, 2B, 3, 7 and 10, pressure-sensitive tape 136 may be disposed along at least a portion of the elongate dimension of the electrical assembly 124, particularly along its first portion 124A, as well as (depending on the extent of the adhesion needed and as shown in FIG. 2B) how it may extend along a substantial entirety of both the first and second portions 124A, 124B leaving, as shown in an exemplary way in FIG. 5, a relatively short exposed portion 128A of the metal ribbon 128. In one form, the thickness of the pressure-sensitive tape 136 may be between about 0.1 and 0.4 mm. Through a combination of thin, flexible construction and the use of the pressure-sensitive tape 136, the terminal 126 and a portion of the insulating outer body 142 and metal ribbon 128 may be bonded to the second major surface 114 of the inner ultra-thin glass plate 104, while the remainder of the metal ribbon 128 and the insulating outer body 142 may be wrapped or folded over an edge of the laminated glass assembly 100 and extend to be sandwiched between the first major surface 112 of the inner ultra-thin glass plate 104 and one or the other of the intermediate layer 106 and the outer glass plate 102. Upon such folding, the electrical assembly 124 may be attached such that the second portion 124B and terminal 126 face inward (that is to say, toward a vehicular cabin when the laminated glass assembly 100 is configured as an automotive windshield) while the first portion 124A and the region containing the solder 130 face outward (that is to say, toward an ambient external environment when the laminated glass assembly 100 is configured as an automotive windshield) that, as noted elsewhere, is away from the inner ultra-thin glass plate 104. In one form, other adhesives, such as structural adhesive, PU-based adhesive, hot-melt adhesive, quick-drying adhesive, epoxy resin, light-curing structural adhesive, anaerobic adhesive or combinations thereof may be used in place of or in conjunction with the pressure-sensitive tape 136, and that all such variants are within the scope of the present disclosure.

Figure 4:
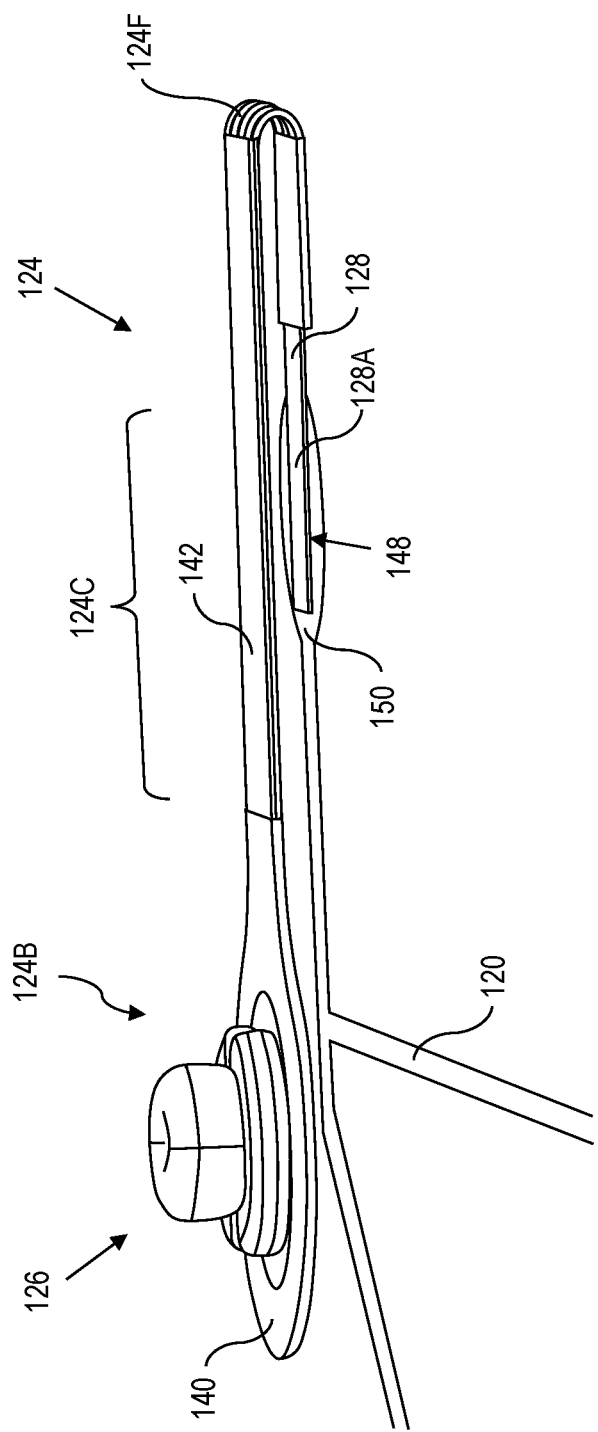
FIG. 4 is an edge perspective view of the tongue joint in electrical connection to a conductive medium.

Referring with particularity to FIG. 4, an edge perspective view of the electrical assembly 124 being coupled to a conductive medium 120 is shown, where—among other components—the outer glass plate 102, inner ultra-thin glass plate 104 and intermediate layer 106 have been omitted for ease of viewing. As discussed herein, the conductive medium 120 may correspond to windshield-mounted or windshield-integrated electrical circuitry that may be used for conveying electrical signals between the laminated glass assembly 100 and vehicle electronics (not shown) for the purpose of performing heating, defrosting, anti-fogging, selective opacity or color changing, receiving wireless signals, for implementing a HUD, for connecting to a camera, sensor or other vehicular electronic equipment. In one form, the conductive medium 120 may be configured as a pre-laid metal wire (made from, for example, copper, tungsten or the like), while in another, as a conductive trace (made from a metal-based paste, conductive ink or the like, using silver, silver alloy or related conductive material) that can be deposited on or otherwise applied to an appropriate surface of one of the glass layers. As shown, the conductive medium 120 may be connected to the electrical assembly 124 at the exposed portion 128A of the metal ribbon 128 through a solder deposit 148 at a receiving pad 150. Significantly, the elongate nature of the electrical assembly 124 allows for the receiving pad 150 of the conductive medium 120 to be placed farther from an edge of the laminated glass assembly 100. While the precise location of a welding or related connecting point between the electrical assembly 124 and the one or more layers of the laminated glass assembly 100 can vary depending upon the end-use, in a practical sense, the location of the welding point may be somewhere between about 10 and 20 mm from the edge of the glass layer. This placement, along with the low-temperature methods of adhesion between the electrical assembly 124 and one or more of the glass or polymer layers that make up the bulk of the laminated glass assembly 100, will help reduce bubbling, cracking, splintering or other possible defects that may arise out of welding or other parts of the laminate manufacturing process.

Figure 3:
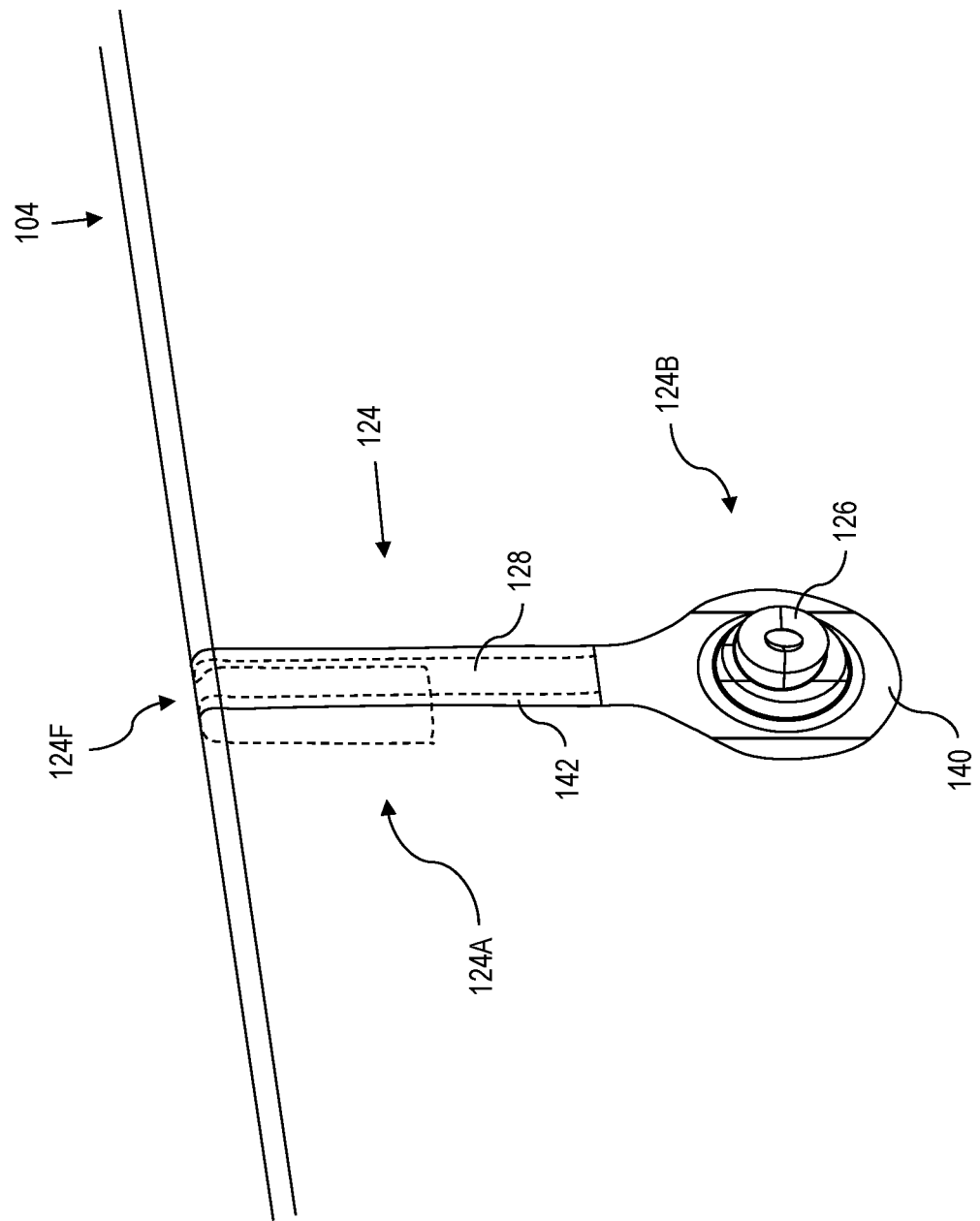
FIG. 3 is a perspective view of a tongue joint that makes up a portion of the electrical assembly of FIG. 1 bending around the edge of one of the layers of glass that make up the laminated glass assembly.

Referring again to FIG. 5, a top view of one embodiment of the tongue joint that makes up a portion of the electrical assembly 124 is illustrated. Certain representative dimensions of this embodiment are discussed next. The tongue joint has an overall length LT (which, as previously stated, may be about 65 mm), while at the widest part as defined by the terminal pad 140 (and insulating outer body 142) defines a generally circular shape having a diameter of approximately 16 mm, also as previously indicated. A cutout 144 is formed in the insulating outer body 142 that encases the metal ribbon 128 to allow for direct electrical contact between the metal ribbon 128 and the terminal 126. For instance, an 11 mm circular cutout can be provided for the terminal 126. A midsection 124C defines a generally rectangular portion of the electrical assembly 124 that is situated between the head and tail and that bridges one or both of the first and second portions 124A, 124B. A portion L1 of the length of the midsection 124C may be configured to have an optional peel tab that can act as—or otherwise be cooperative with—a release liner 124D that upon removal would expose underlying adhesive such as the pressure-sensitive tape 136 that is adhered to the reverse of the metal ribbon 128 as shown in FIGS. 1, 2A and 2B. The release liner 124D is presently shown with a discrete length L1 through the presence of intermittent laterally-extending die cuts; it will be appreciated that their number and frequency may be dictated by the amount of exposure of the pressure-sensitive tape 136 (and consequent adhesive bonding between the electrical assembly 124 and one or more facingly-adjacent surfaces of the laminated glass assembly 100) is needed. Another portion L2 of the length of the midsection 124C is configured such that a common edge forms a divider 124E that defines the location along the electrical assembly 124 that is adjacent the edge (rather than one of the major surfaces) of the laminated glass assembly 100 upon electrical assembly 124 folding, such as shown in FIG. 3. In such case, upon folding and attachment to the laminated glass assembly 100, the portion of the midsection 124C corresponding to L1 would be seen as being disposed directly over the portion of the midsection 124C corresponding to L2 when being viewed from a passenger cabin of a vehicle. As such, divider 124E may make it easy for a fabrication or installer to align the electrical assembly 124 with the laminated glass assembly 100. It will be appreciated that the divider 124E can be physical or conceptual to define a foldover point 124F (as shown in FIGS. 3 and 4) that corresponds to the location where the electrical assembly 124 is wrapped around the edge of the laminated glass assembly 100. In circumstances where the divider 124E is a physical embodiment, it too can be formed by known cutting approaches, such as by die cutting or the like.

In one form, the first length L1 can be approximately 9 mm, while the second length L2 can be approximately 6 to 8 mm. The tail at the first portion 124A is illustrated in two segments, designated by length L3 and length L4 where it will be appreciated that L3 generally corresponds to the exposed portion 128A of the metal ribbon 128 and L4 generally corresponds to a solder deposit (such as solder 130) that in one form may be about 0.2 mm thick. In one form, a combined length L3+L4 of the tail is approximately 10.5 mm, with L3 being approximately 4.1 mm and L4 being approximately 6.4 mm. As the tail corresponds to a portion of the metal ribbon 128 that is not sheathed in the insulating outer body 142, its width (which is approximately 3.5 mm in one form) is more narrow than the midsection 124C and second portion 124B.

Figure 6:
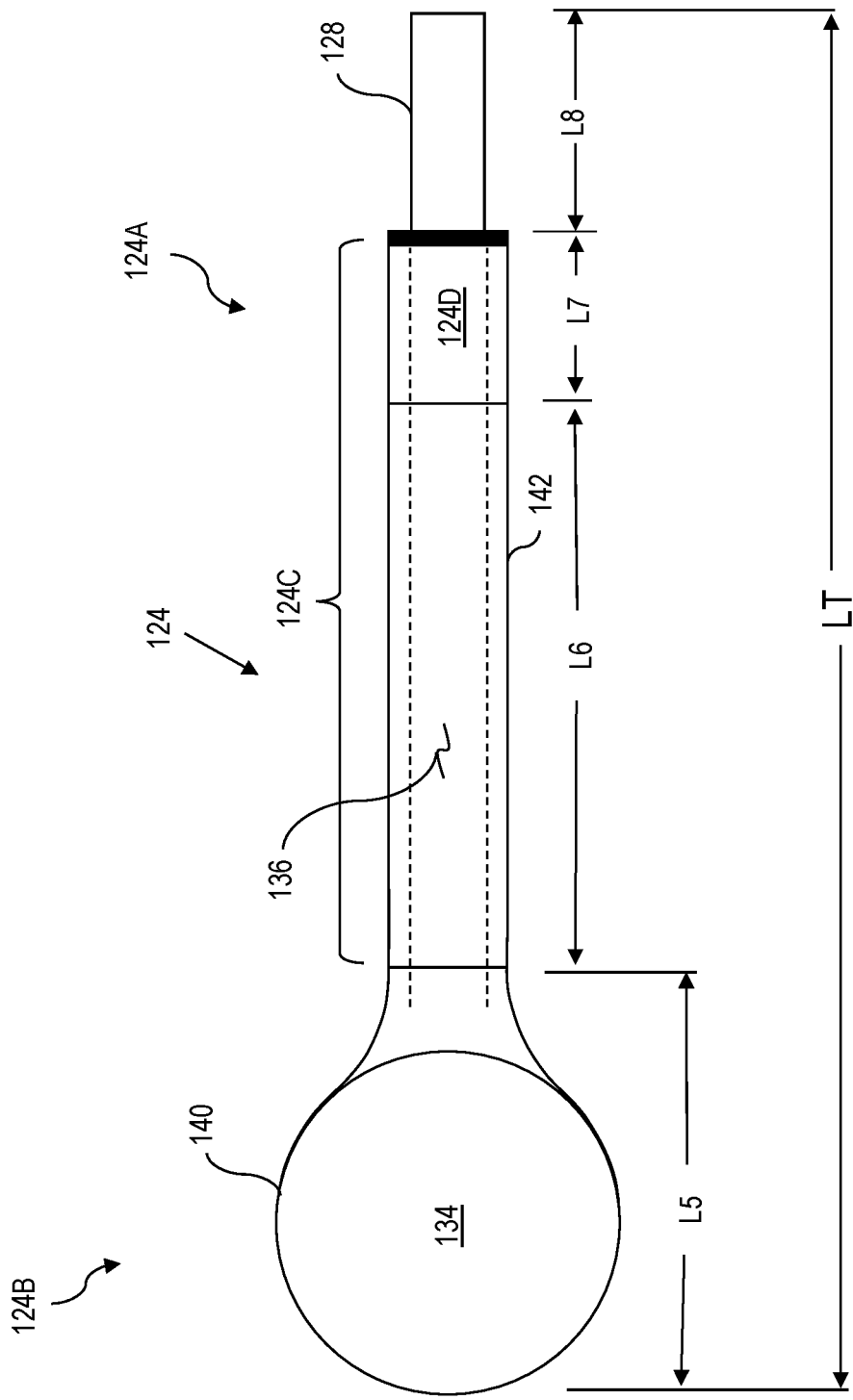
FIG. 6 is a bottom view of the tongue joint of FIG. 4.

Referring with particularity to FIG. 6, a bottom view of the embodiment of the tongue joint that makes up a portion of the electrical assembly 124 from FIG. 5 is illustrated. In an example configuration, the back of the terminal pad 140 defines a generally circular shape that is covered with a layer of tape, such as the previously-discussed structural bonding tape 134. In an example configuration, a length L5 of the remote end of the second portion 124B that encompasses the terminal pad 140 and structural bonding tape 134, including a neck portion that shoulders down into the midsection 124C, can be approximately 20 mm. Lengths L6 and L7 correspond to the midsection 124C where L6 may have a length of approximately 24 to 26 mm and L7 of about 9 mm that can be covered by a peel tab similar to the aforementioned peel tab 124D, release liner or other means to protect an underlying adhesive until use. The length L8 is analogous to that of L3+L4 of FIG. 5, specifically 10.5 mm in length and forms the exposed portion 128A of the remote tail end of metal ribbon 128.

Figure 7:
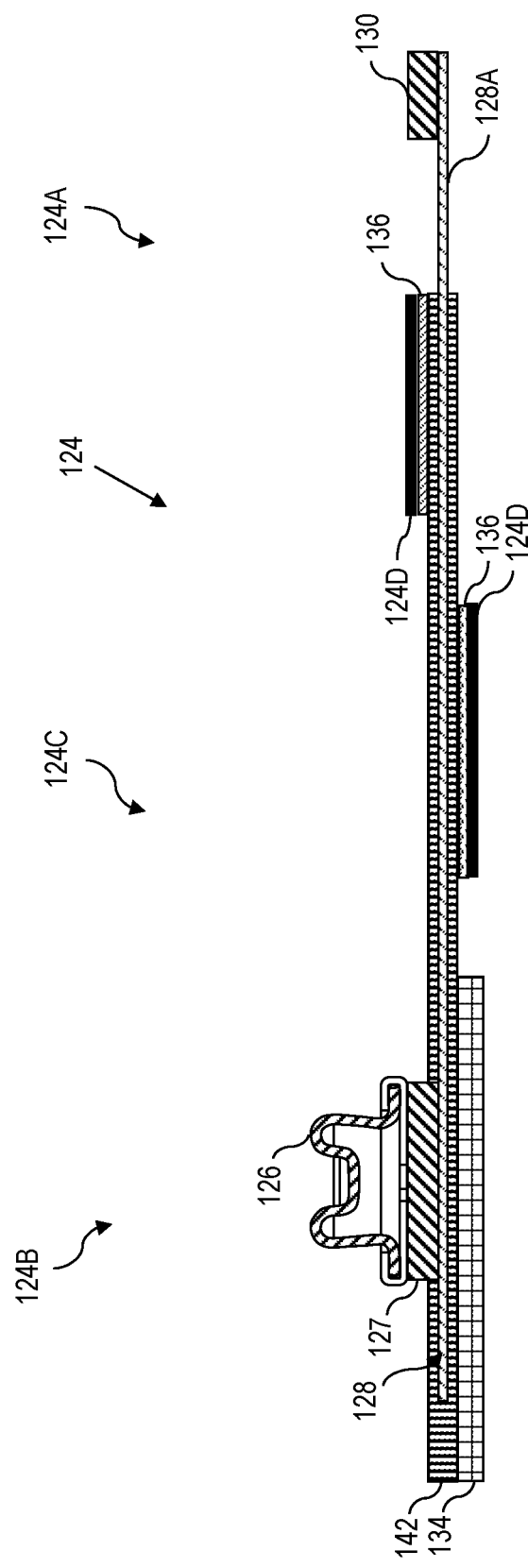
FIG. 7 is an edge cutaway view of one embodiment of the tongue joint of FIG. 4.

Referring with particularity to FIG. 7, an edge cutaway view shows the cooperation of the various components that correspond to the lengths L1 through L8 of FIGS. 5 and 6. As can be seen, the metal ribbon 128 (shown with diagonal hatching) extends along almost the entirety of the length of the electrical assembly 124. The terminal 126 is situated in the circular cutout that is formed in the vertical hatched portion that represents the insulating outer body 142. In this way, the terminal 126 can be attached to the metal ribbon 128 at the head end of the second portion 124B. As shown, such attachment may be through welding, soldering or a related connection mechanism 127 that ensures electrical continuity between the terminal 126 and the metal ribbon 128. The structural bonding tape 134 is shown in diagonal hatch at the head end of the second portion 124B underneath the metal ribbon 128. In looking at the obverse of the electrical assembly 124, the peel tab 124D (with accompanying release layer) is placed on an upper surface of a portion of the length of the insulating outer body 142, while an adhesive layer as previously described is disposed between the peel tab 124D and the insulating outer body 142. Although not shown, as previously discussed in conjunction with the peel tab 124D, in another form the peel tab 124D may be made to be coplanar with a top surface of the insulating outer body 142 such that upon removal of the peel tab 124D, a portion of the metal ribbon 128 becomes exposed. A layer of solder 130 may be disposed on the metal ribbon at the tail end of the first portion 124A. As previously discussed, upon folding the electrical assembly 124 upon itself at the foldover point 124F that is somewhere along the first portion 124A or midsection 124C, the resulting shape causes the solder 130 to face in a direction opposite of the terminal 126 and the inner ultra-thin glass plate 104; in this way, upon attachment of the electrical assembly 124 to the various layers of the laminated glass assembly 100, the solder 130 may be placed in facingly-adjacent contact with the conductive medium 120 or outer glass plate 102 of FIGS. 1, 2A and 2B. In looking at the reverse of the electrical assembly 124, the structural bonding tape 134 is generally coplanar with the lower surface of the insulating outer body 142 as well as a layer of adhesive (such as the aforementioned pressure-sensitive tape 136). A peel tab (such as one similar to the aforementioned peel tab 124D) may disposed on top of the adhesive such that upon its removal, the adhesive becomes exposed.

Although not shown, it will be appreciated that other shapes and sizes of the electrical assembly 124 may be formed, and that all are within the scope of the present disclosure. For example, in one embodiment the overall length LT may be approximately 91 mm, while in another example there is no taper when extending from the second portion 124B to the first portion 124A such that the width W remains at a constant 16 mm. Similarly, the various lengths L1 through L8 may have different dimensions, depending on the way the present embodiment is secured to the remainder of the laminated glass assembly 100. In a similar way, the electrical assembly 124 may be conceptually divided into several regions, including a first region 124A, a second region 124B and a midsection 124C where one or more of the regions may include the selective use of an adhesive (such as the previously-discussed pressure-sensitive tape 136) and, if needed, release layer, peel tab 124D or the like.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and its variant "comprising", when used in this specification, specify the presence of stated features, integers, steps, operations, elements, or components, but do not preclude the presence or addition of one or more other features, integers, steps, operations, elements, components or groups thereof.

Within the present disclosure, the use of the prepositional phrase "at least one of" is deemed to be an open-ended expression that has both conjunctive and disjunctive attributes. For example, a claim that states "at least one of A, B and C" (where A, B and C are definite or indefinite articles that are the referents of the prepositional phrase) means A alone, B alone, C alone, A and B together, A and C together, B and C together or A, B and C together.

Within the present disclosure, the following claims are not written in means-plus-function format and are not intended to be interpreted based on 35 USC 112(f) unless and until such claim limitations expressly use the phrase "means for" followed by a statement of function void of further structure. To the extent that any means or step plus function elements may now or in the future be included in the claims, any such corresponding structures, materials, acts and equivalents of all means or step plus function elements are intended to include any structure, material or act for performing the function in combination with other claimed elements as specifically claimed.

The description of the present disclosure has been presented for purposes of illustration only and as such not intended to be exhaustive or limited. Many modifications and variations will be apparent to those of ordinary skill in the art without departing from the scope and spirit of the present disclosure. Aspects of the disclosure were chosen and described in order to best explain the principles of the disclosed subject matter and the practical application, and to enable others of ordinary skill in the art to understand the same for various embodiments with various modifications as are suited to the particular use contemplated.

What is claimed is:

1. A laminated glass assembly comprising:
   a multilayer structure comprising an outer glass plate, an inner ultra-thin glass plate and an intermediate film layer disposed between the outer glass plate and the inner ultra-thin glass plate;
   an electrical assembly that defines a flexible construction comprising:
      a first portion that terminates in a tail;
      a second portion that terminates in a head that defines a terminal pad, the head situated at an opposite end of the electrical assembly from the tail;
      a metal ribbon that extends from the first portion to the second portion;
      a terminal disposed on the terminal pad; and
      an insulating outer body disposed about at least a midsection portion of the metal ribbon, the midsection portion having at least one adhesive secured to at least a portion of the insulating outer body;
   a layer of solder; and
   a conductive medium defining electrical circuitry that is positioned between the outer glass plate and the inner ultra-thin glass plate, the conductive medium disposed directly against a major surface of the outer glass plate and between it and the layer of solder that is disposed directly against a portion of the first portion of the electrical assembly such that direct contact between the solder, the conductive medium and the inner ultra-thin glass plate is prevented, wherein the flexible construction permits the electrical assembly to wrap around an edge of the multilayer structure to establish signal connectivity between the terminal pad and the conductive medium such that upon adhesive securing of the electrical assembly to the multilayer structure and the conductive medium, a major surface of the inner ultra-thin glass plate is coupled to the terminal pad such that the terminal and at least a portion of the metal ribbon and insulating outer body are situated above the structural bonding tape to form a secure adhesive connection with the major surface of the inner ultra-thin glass plate that reduces exposure of at least the major surface of the inner ultra-thin glass plate to any soldering, welding or related heat-based problems.

2. The laminated glass assembly of claim 1, wherein the electrical assembly is configured as a tongue joint with a length dimension that is elongate relative to a width dimension.

3. The laminated glass assembly of claim 2, wherein the tongue joint is bonded to the inner ultra-thin glass plate.

4. The laminated glass assembly of claim 2, wherein the tongue joint is a single joint terminal or a plurality of joint terminals.

5. The laminated glass assembly of claim 1, wherein the material of the outer glass plate is selected from soda lime glass, aluminosilicate glass, borosilicate glass, polymethyl methacrylate or polycarbonate, and the thickness of the outer glass plate is between 1.5 and 6 millimeters.

6. The laminated glass assembly of claim 1, wherein the material of the inner ultra-thin glass plate is selected from at least one of a high-aluminum silicate glass, borosilicate glass and lithium aluminum silicate glass with a thickness of between 0.4 and 1.2 millimeters.

7. The laminated glass assembly of claim 1, wherein the intermediate film layer is an organic polymer intermediate film material.

8. The laminated glass assembly of claim 7, wherein the organic polymer intermediate film material is selected from a group consisting of polyvinyl butyral, ionoplast, ethylene vinyl acetate, polyurethane film and combinations thereof.

9. The laminated glass assembly of claim 7, wherein the organic polymer intermediate film material is a material with a color film layer.

10. The laminated glass assembly of claim 7, wherein the organic polymer intermediate film material is a colorless transparent film layer.

11. The laminated glass assembly of claim 7, wherein the outer glass plate, intermediate film layer, and inner ultra-thin glass are permanently bonded together after high-temperature pre-pressing or vacuuming and high-temperature and high-pressure processing.

12. The laminated glass assembly of claim 1, wherein the conductive medium is a metal wire or a transparent conductive film and the metal layer is selected from gold, gold alloy, silver, silver alloy, copper, copper alloy, aluminum, aluminum alloy, molybdenum or molybdenum alloy.

13. The laminated glass assembly of claim 1, wherein the conductive medium is copper wire, tungsten wire, aluminum wire or silver wire, and the conductive medium is used to perform at least one of heating, defrosting, anti-fogging, discoloration and receiving wireless signals.

14. The laminated glass assembly of claim 1, wherein the conductive medium is a transparent conductive film that includes a metal coating, a metal alloy layer or a metal oxide layer.

15. The laminated glass assembly of claim 14, wherein the transparent conductive film is a metal alloy layer comprising a silver or silver alloy.

16. The laminated glass assembly of claim 14, wherein the transparent conductive film is a metal oxide layer comprising an indium tin oxide layer, a fluorine-doped tin oxide layer, an antimony-doped tin oxide layer or aluminum-doped zinc oxide layer.

17. The laminated glass assembly of claim 1, wherein the multilayer structure is optically transparent.

18. An electrical assembly that defines a flexible construction for a laminated glass assembly, the electrical assembly comprising:
- a first portion that terminates in a tail;
- a second portion that terminates in a head that defines a terminal pad, the head situated at an opposite end of the electrical assembly from the tail;
- a terminal disposed on the terminal pad;
- a metal ribbon that extends from the first portion to the second portion;
- an insulating outer body disposed about at least a midsection portion of the metal ribbon, the midsection portion having at least one adhesive secured to at least a portion of the insulating outer body;
- a layer of solder that is disposed directly against a portion of the first portion of the electrical assembly; and
- a conductive medium defining electrical circuitry, the conductive medium disposed against the layer of solder such that direct contact between the solder and an inner ultra-thin glass plate of a laminated glass assembly is prevented, wherein the flexible construction permits the electrical assembly to wrap around an edge of the laminated glass assembly to establish signal connectivity between the terminal pad and the conductive medium such that upon adhesive securing of the electrical assembly to the laminated glass assembly and the conductive medium, a major surface of the inner ultra-thin glass plate is coupled to the terminal pad such that the terminal and at least a portion of the metal ribbon and insulating outer body are situated above the structural bonding tape to form a secure adhesive connection with the major surface of the inner ultra-thin glass plate that reduces exposure of at least the major surface of the inner ultra-thin glass plate to any soldering, welding or related heat-based problems.

* * * * *